United States Patent
Nowling et al.

(10) Patent No.: US 9,330,937 B2
(45) Date of Patent: May 3, 2016

(54) ETCHING OF SEMICONDUCTOR STRUCTURES THAT INCLUDE TITANIUM-BASED LAYERS

(71) Applicant: Intermolecular Inc., San Jose, CA (US)

(72) Inventors: Gregory Nowling, San Jose, CA (US); John Foster, Mountain View, CA (US)

(73) Assignee: Intermolecular, Inc., San Jose, CA (US)

( * ) Notice: Subject to any disclaimer, the term of this patent is extended or adjusted under 35 U.S.C. 154(b) by 39 days.

(21) Appl. No.: 14/079,473

(22) Filed: Nov. 13, 2013

(65) Prior Publication Data

US 2015/0132953 A1    May 14, 2015

(51) Int. Cl.

| | | |
|---|---|---|
| C23F 1/00 | (2006.01) | |
| C03C 15/00 | (2006.01) | |
| C03C 25/68 | (2006.01) | |
| C25F 3/00 | (2006.01) | |
| H01L 21/3213 | (2006.01) | |
| H01L 21/67 | (2006.01) | |
| H01J 37/32 | (2006.01) | |
| C23F 1/26 | (2006.01) | |
| C23F 4/00 | (2006.01) | |

(52) U.S. Cl.
CPC ............ *H01L 21/32133* (2013.01); *C23F 1/26* (2013.01); *C23F 4/00* (2013.01); *H01J 37/32357* (2013.01); *H01L 21/67086* (2013.01); *H01J 2237/334* (2013.01)

(58) Field of Classification Search
USPC .......................................................... 216/83
See application file for complete search history.

(56) References Cited

U.S. PATENT DOCUMENTS

| | | | |
|---|---|---|---|
| 5,948,702 | A | 9/1999 | Rotondaro |
| 6,150,272 | A * | 11/2000 | Liu et al. ........................ 438/692 |
| 6,200,910 | B1 | 3/2001 | O'Brien et al. |
| 7,244,682 | B2 | 7/2007 | Shea |
| 7,741,230 | B2 | 6/2010 | Rachmady |
| 8,105,851 | B1 | 1/2012 | Ku |
| 2004/0140291 | A1 | 7/2004 | Swanson |
| 2010/0252774 | A1* | 10/2010 | Shida et al. ................... 252/79.1 |
| 2010/0313758 | A1* | 12/2010 | Stevens et al. ..................... 96/10 |
| 2012/0001262 | A1* | 1/2012 | Kang et al. ..................... 257/368 |
| 2013/0045596 | A1* | 2/2013 | Eda et al. ........................ 438/692 |
| 2013/0048904 | A1 | 2/2013 | Adaniya |

FOREIGN PATENT DOCUMENTS

| | | | |
|---|---|---|---|
| JP | 61136203 | A | 6/1986 |
| JP | 63020489 | A | 1/1988 |
| JP | 2008191624 | A | 8/2008 |

* cited by examiner

*Primary Examiner* — Thomas Pham

(57) ABSTRACT

Two-step process sequences uniformly etch both tungsten-based and titanium-based structures on a substrate. A sequence of wet etches using peroxide and heated nitric acid uniformly recesses a metal stack that includes W, TiN, and TiAl. W, TiN and TiC are uniformly recessed by a peroxide etch at ~25 C followed by an acid solution with a very small amount of added peroxide at ~60 C. TiC is etched without etching trench oxides or other metals in a work-function metal stack by either (1) highly-dilute of ultra-dilute HF at 25-35 C, (2) dilute HCl at 25-60 C, (3) dilute $NH_4OH$ at 25-60 C, or (4) solution (2) or (3) with small amounts of peroxide. Other metals in the stack may then be plasma-etched without being blocked by TiC residues.

15 Claims, 5 Drawing Sheets

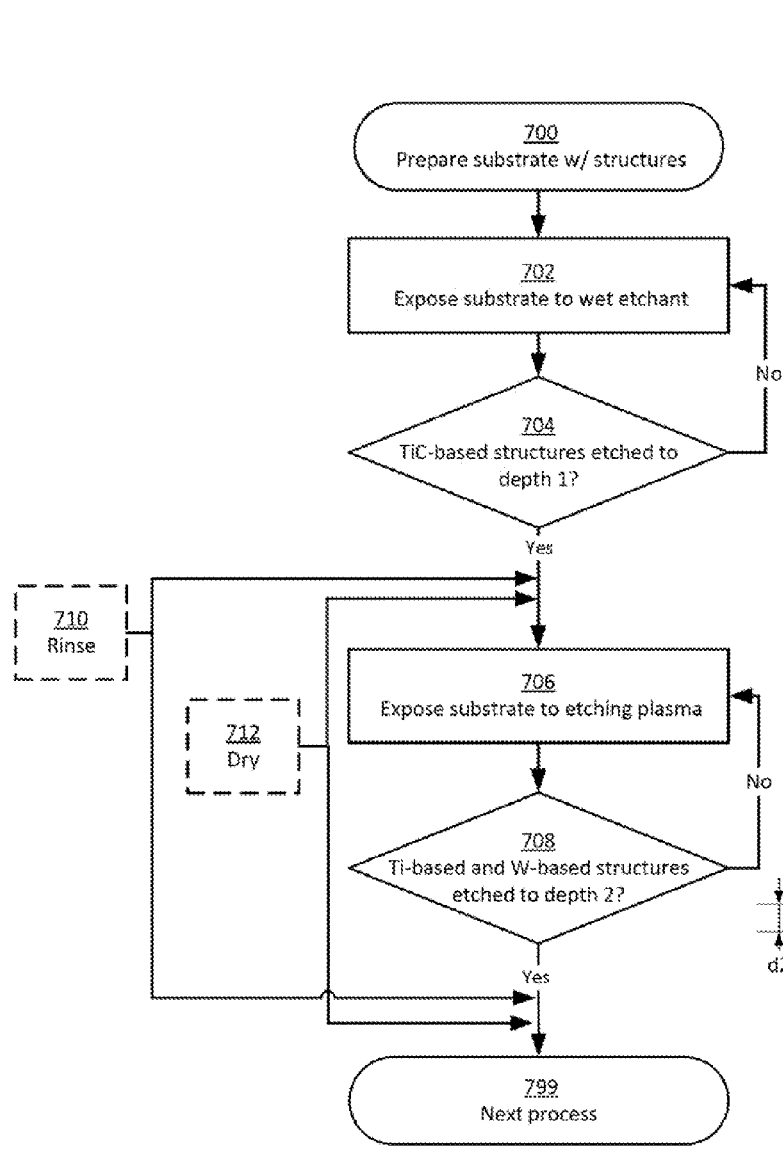
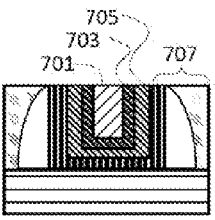
FIG. 7B
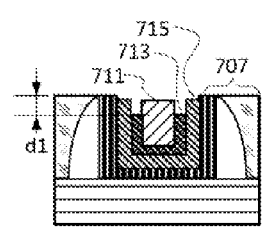
FIG. 7C
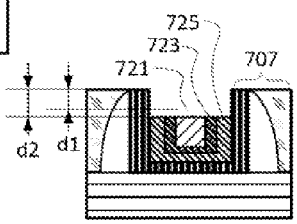
FIG. 7D
FIG. 7A

ETCHING OF SEMICONDUCTOR STRUCTURES THAT INCLUDE TITANIUM-BASED LAYERS

BACKGROUND

Related fields include semiconductor fabrication; specifically, etching of structures having multiple layers of different compositions, and most particularly where some of the layers include titanium or a titanium compound.

In fabricating semiconductor devices, the formation of various material layers on a substrate is followed by patterning the layers to form structures (e.g., transistors, capacitors, interconnects, and others). "Etching," used herein to mean "removal of at least part of a layer or structure," is often part of the patterning process. Etching can include dry processes (e.g., plasma etching, plasma-less gas etching, sputter etching, ion milling, reactive ion etching (RIE)) or wet processes (e.g., applying an acid, base, or solvent to dissolve part of the structure, or an abrasive formulation to polish away part of the structure).

Where only one material is exposed to the etchant, some primary concerns may be etch rate, feature resolution, and residues left behind by the process. Where more than one material is exposed to the etchant, these concerns are also important, but the constraints may multiply. For example, the intent may be to etch one or more of the materials to a greater depth while etching the other materials to a lesser depth ("selective etching"). In highly selective etching, the intent may be to leave one or more other materials substantially intact despite exposure to the etchant. In other situations, it may be advantageous to etch multiple materials to within 5-15% of the same depth ("uniform etching").

Besides the composition of the layer, the formation method of the layer may influence its etching behavior. For example, some materials deposited by atomic layer deposition (ALD) are more difficult to etch than the same material deposited by physical vapor deposition (PVD).

As an example, consider a metal stack that includes tungsten (W) and a titanium-based material such as titanium nitride (TiN), titanium carbide (TiC) or titanium aluminide (TiAl). In some applications, it is desirable to etch the W and the Ti-based material(s) non-selectively, i.e., at about the same rate, to recess them all to the same depth by the same process. Solutions of hydrogen peroxide ($H_2O_2$), such as commercial sulfuric acid/peroxide mixture (SPM), Standard Clean 1 (SC-1), or Standard Clean 2 (SC-2), etch all these materials. However, they etch W much faster than they etch the Ti-based materials, producing a selective etch rather than the desired uniform etch.

Plasma etching can etch W and many Ti-based materials at similar rates, but TiC is an exception. Plasma etching of TiC creates excess residues that block further etching of the materials underneath the residue.

Therefore, a need exists for formulations and methods to simply and cost-effectively etch W and Ti-based materials to a common recess depth.

SUMMARY

The following summary presents some concepts in a simplified form as an introduction to the detailed description that follows. It does not necessarily identify key or critical elements and is not intended to reflect a scope of invention.

Methods and formulations for etching titanium-based materials and tungsten include embodiments of a two-step process to uniformly etch TiN, TiAl, TiC, and W structures on a semiconductor substrate. Some embodiments begin by exposing the structures to a solution containing hydrogen peroxide ($H_2O_2$) until the W structure is etched to nearly the desired depth (e.g., more than about 75% of the desired depth). When that condition is met, the substrate is exposed to a heated solution of concentrated nitric acid ($HNO_3$) to etch the TiN and/or the TiAl and/or the TiC and complete the W etch so that all the materials are etched to the desired depth. For example, the desired depth may be between 20 and 40 nm, or about 30 nm. Rinsing and/or drying processes may be done between the steps.

Methods and formulations for etching titanium-based materials and tungsten include embodiments of a two-step process to uniformly etch TiN, TiC, and W structures on a semiconductor substrate. Some embodiments begin by exposing the structures to a room-temperature solution containing hydrogen peroxide ($H_2O_2$) until the W structure is etched to nearly the desired depth (e.g., more than about 75% of the desired depth). When that condition is met, the substrate is exposed to a dilute hydrochloric acid (HCl) solution with a very small amount of added $H_2O_2$ to etch the TiN and/or the TiC until all the materials are etched to the desired depth. For example, the desired depth may be between 20 and 40 nm, or about 30 nm. Rinsing and/or drying processes may be done between the steps.

Methods and formulations for etching titanium-based materials and tungsten include embodiments of a two-step process to uniformly etch TiC, W, and other metals used in work-function stacks on a semiconductor substrate without damaging nearby oxides (e.g., trench oxides). Some embodiments begin by exposing the structures to a solution containing dilute HCl, hydrofluoric acid (HF), or dilute ammonium hydroxide ($NH_4OH$), with or without a small amount of $H_2O_2$, until the TiC (or related ternary carbide such as TiAlC) structure is etched to nearly the desired depth (e.g., within 20%). When that condition is met, the substrate is exposed to an etching plasma until all the materials are etched to the desired depth. For example, the desired depth may be between 20 and 40 nm, or about 30 nm. Prior etching of the TiC (or related carbide) limits the residues produced by plasma etching of TiC, so that the residues do not block the plasma from the other materials. Rinsing and/or drying processes may be done between the steps.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

FIG. 7A is a flowchart of an example method for uniformly etching W with TiN and TiC, TiAlC, or another TiC compound by a two-step wet/plasma process. FIGS. 7B-7D conceptually illustrate a multi-material structure at different stages of FIG. 7A's process.

DETAILED DESCRIPTION OF EXAMPLE EMBODIMENTS

To avoid unnecessarily obscuring the description, some technical material known in the related fields is not described in detail. Semiconductor fabrication generally requires many other processes before and after those described; this description omits steps that are irrelevant to, or that may be performed independently of, the described processes.

Unless the text or context clearly dictates otherwise: (1) by default, singular articles "a," "an," and "the" (or the absence of an article) may also encompass plural variations; for example, "a layer" may mean "one or more layers." (2) "Or" in a list of multiple items means that any, all, or any combination of less than all the items in the list may be used in the invention. (3) Where a range of values is provided, each intervening value is encompassed within the invention. (4) "About" or "approximately" contemplates up to 10% variation. "Substantially" contemplates up to 5% variation.

As used herein: "Conformal" shall mean "more than 60% conformal." "Etch" shall mean any chemical removal of solid material, whether or not the material is being removed in any specific pattern. "Dopant" shall mean a minor constituent (generally <20 atomic %) of a layer or material. "Substrate" may refer to any workpiece on which formation or treatment of material layers is desired. Substrates may include, without limitation, silicon, silica, sapphire, zinc oxide, SiC, AlN, GaN, Spinel, coated silicon, silicon on oxide, silicon carbide on oxide, glass, gallium nitride, indium nitride and aluminum nitride, and combinations (or alloys) thereof. The term "substrate" or "wafer" may be used interchangeably herein. Semiconductor wafer shapes and sizes can vary and include commonly used round wafers of 50 mm, 100 mm, 150 mm, 200 mm, 300 mm, or 450 mm in diameter.

FIGS. 1A-1D conceptually illustrate an example of a multi-material structure that can be etched. The sequence of diagrams is loosely based on a "gate-last" or "dummy gate" process for making a transistor; many other processes in semiconductor fabrication can also produce structures with multiple exposed materials.

Figure 1A:
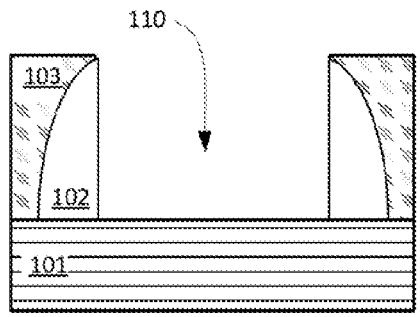
FIGS. 1A-1D conceptually illustrate an example of a multi-material structure that can be etched.

In FIG. 1A, spacers 102 and interlayer dielectric (ILD) 103 were formed previously formed around a sacrificial "dummy" gate on substrate 101. Then the dummy gate was etched away, leaving empty trench 110. Often, substrate 101 will have other layers or structures (e.g., source and drain regions) underneath the ILD and spacers shown here.

Figure 1B:
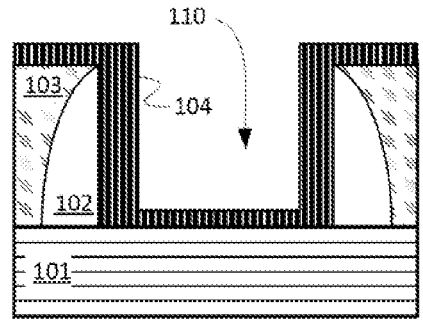

In FIG. 1B, a conformal layer 104 is formed over the remaining structures on substrate 101, its surface following the contours of trench 110 and partially filling it in. For example, conformal layer 104 may be formed by ALD or epitaxy. In some embodiments, layer 104 may be a "high-k" metal gate material such as hafnium oxide or zirconium oxide. In some embodiments, a conformal interface buffer layer is formed under or before the high-k layer.

Figure 1C:
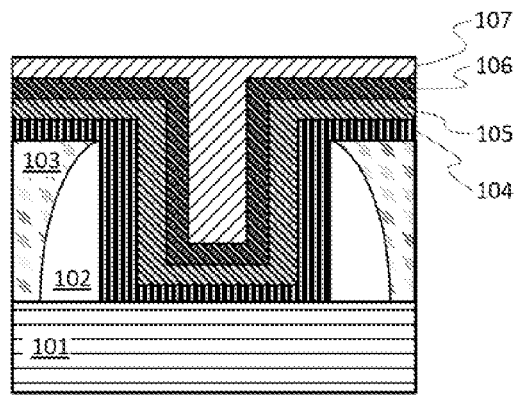

In FIG. 1C, additional layers 105, 106, and 107 are formed over conformal layer 104. Layers 105 and 106 are a simplified representation of what may in practice be many layers including work-function layers, buffers, diffusion barriers, wetting layers, and other layers. Layers 105 and 106 may include titanium-based materials such as TiC, TiN, TiAl, or ternary compounds such as TiAlN. In some embodiments, topmost layer 107 is a "fill metal" such as tungsten (alternatively, copper or aluminum) intended to overfill the trench. Fill metal layers may be formed by methods that may not produce highly conformal coatings, such as PVD.

Figure 1D:
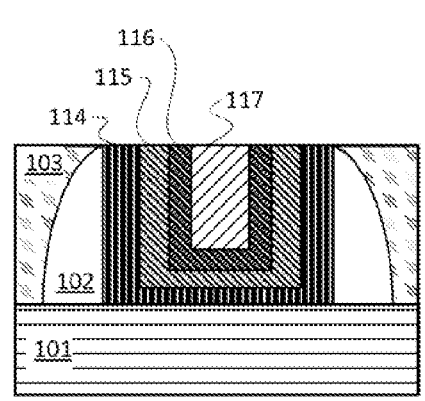

In FIG. 1D, all the materials above spacers 102 have been removed. Chemical-mechanical polishing (CMP) is a common approach to remove all excess materials to a common level. The top surface now has multiple exposed materials: ILD 103, the tips of spacers 102, and pre-etch structures 114, 115, 116, and 117 (created from the materials of layers 104, 105, 106, and 107, respectively).

Figure 2:
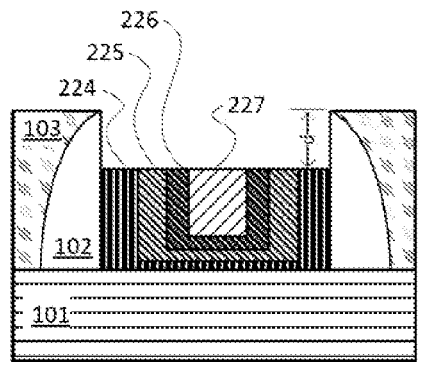
FIG. 2 conceptually illustrates an example of a desired end result of uniform etching.

FIG. 2 conceptually illustrates an example of a desired end result of uniform etching. ILD 103 and spacers 102 are substantially intact, while structures 224, 225, 226, and 227 are all recessed to the same depth d below the former top surface of structures 114, 115, 116, and 117. The recess depth d may be between 5 nm and 50 nm; in some embodiments, about 30 nm. In general, it is desirable to recess the multiple materials by as quick and simple a method as possible. However, in some instances a two-step etch, with each step selecting different materials, may be faster or less damaging to other structures than some one-step etch processes.

Figure 3:
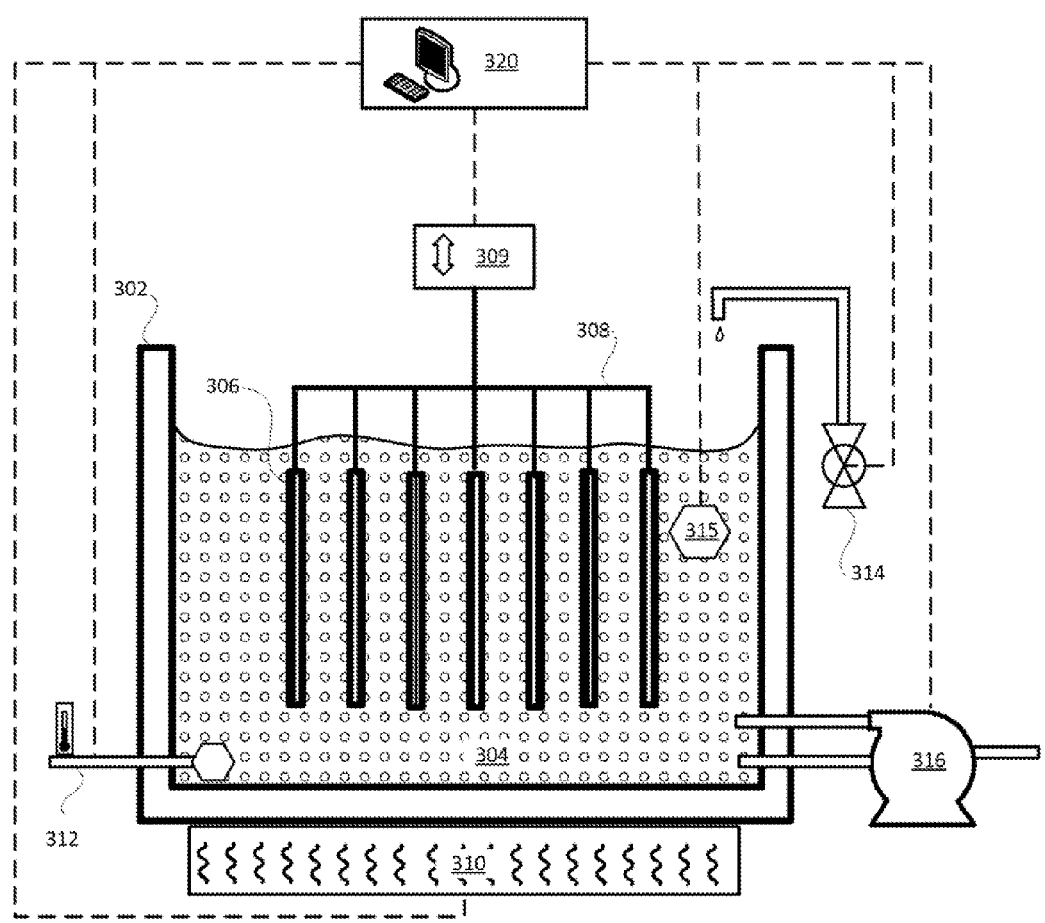
FIG. 3 is a block diagram of an example of an etching apparatus.

FIG. 3 is a block diagram of an example of an etching apparatus. Bath 302 contains etchant 304. One or more substrates 306 may be immersed in bath 302 to expose structures on substrate 306 to etchant 304. Substrate 306 may be supported by substrate holder 308, which may be attached to drive 309 for moving substrate holder 308. Some embodiments of drive 309 may translate or rotate substrate 306 in multiple directions. Substrate holder 308 may be moved to insert substrates 306 into bath 302, remove substrates 306 from bath 302, or to move substrates 306 within bath 302 (e.g., to agitate etchant 304 during the etching process).

Liquid delivery system 314 may be configured to supply additional liquids and control the composition of etchant 304. For example, some components of etchant 304 may evaporate from bath 302, and these components may be replenished in bath 302 by liquid delivery system 314. Various sensors 315 (e.g., conductivity sensor, weight sensor) may be used to provide signals about potential changes in composition of etchant 304. Pump 316 may recirculate etchant 304 in bath 302, extract an effluent stream from bath 302, and perform other functions. Heater 310 and temperature sensor 312 (e.g., a thermocouple) may be connected in a control loop to maintain etchant 304 at a predetermined temperature.

System controller 320 may be connected to control process conditions and other functions of the apparatus. Liquid delivery system 314, sensors 315, and pump 316 may be connected for control of the volume and composition of etchant 304 by system controller 320. System controller 320 may be connected to control the operation of heater 310 based on signals received from temperature sensor 312, to maintain etchant 304 at a predetermined temperature. Controller 320 may include one or more memory devices and one or more processors with a central processing unit (CPU) or computer, analog and/or digital input/output connections, stepper motor controller boards, and the like. In some embodiments, controller 320 executes system control software including sets of instructions for controlling timing of operations, temperature of etchant 304, composition of etchant 304, and other parameters. Other computer programs, instructions, and data stored on memory devices accessible by controller 320 may also be employed in some embodiments.

Figure 4:
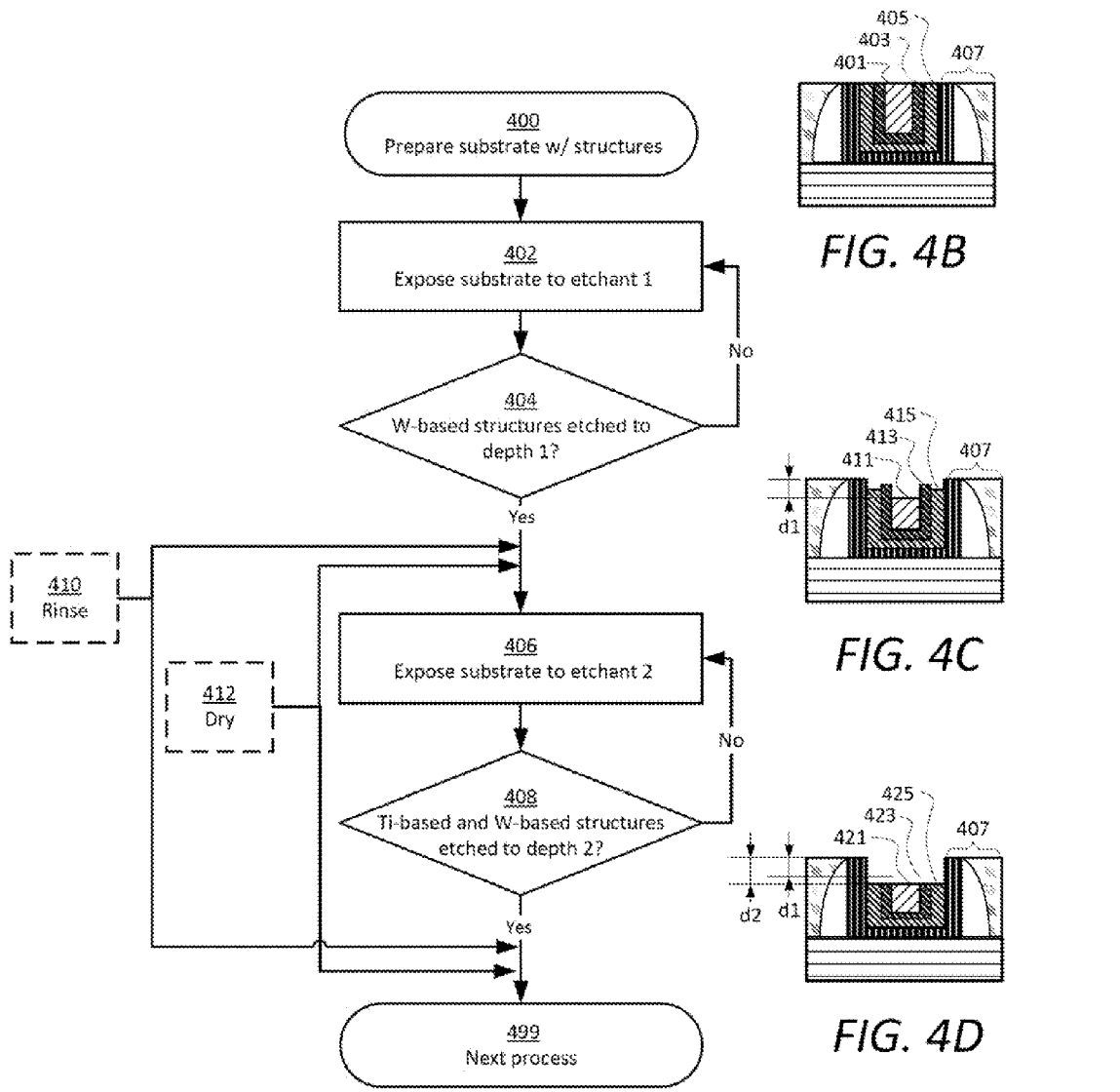
FIG. 4A is a flowchart of an example method for uniformly etching W with TiN and/or TiAl and/or TiC by a two-step wet process.
FIGS. 4B-4D conceptually illustrate a multi-material structure at different stages of FIG. 4A's process.

FIG. 4A is a flowchart of an example method for uniformly etching W with TiN and/or TiAl and/or TiC by a two-step wet process. FIGS. 4B-4D conceptually illustrate a multi-material structure at different stages of FIG. 4A's process. A substrate with structures is initially prepared 400. The structures may include at least one W-based structure 401, at least one Ti-based structure 403 and 405, and other structures 407. The number of W- and Ti-based structures may be any number greater than zero. The structures may or may not have arrangements or shapes similar to the example in FIGS. 4B-4D.

The substrate, with its structures 401, 403, 405, and 407, is exposed 402 to a first etchant. The first etchant may contain $H_2O_2$. Exposure 402 continues until condition 404 is met: W-based structure 401 is recessed to a depth d1, leaving recessed W-based structure 411. Ti-based structures 403 and 405 are etched at the same rate or at a lower rate than W-based structure 401, leaving recessed Ti-based structures 413 and 415 recessed at some depth from 0 to d1. Other structures 407 are etched less than W-based structure 401. In some embodiments, at least one of structures 403, 405, and 407 may be substantially intact after exposure 402. Optionally, the substrate may be rinsed 410 and/or dried 412 after finishing exposure 402 to the first etchant.

Next, the substrate, with its structures 411, 413, 415, and 407, is exposed 406 to a second etchant. Exposure 406 continues until condition 408 is met: recessed W-based structure 411 and Ti-based structures 413 and 415 are uniformly recessed to a depth d2, leaving fully-etched Ti-based structures 423 and 425 and fully-etched W-based structure 421. Other structures 407 are etched less than Ti-based structures 413 and 415. In some embodiments, at least one of other structures 407 may be substantially intact after exposure 406. Optionally, the substrate may be rinsed 410 and/or dried 412 after finishing exposure 406 to the second etchant. The next process can then proceed 499.

Example Process 1

In some embodiments, Ti-based structure 405 contains TiAl or TiC and Ti-based structure 403 contains TiN. Other structures 407 may include TaN or a high-k oxide. The TiAl, TiC, and TiN may additionally include dopants and may be deposited by ALD or PVD. The first etchant is a hydrogen peroxide solution with acid, such as Standard Clean 2 (SC-2; e.g., 1:1:4 $HCl:H_2O_2:H_2O$) at a temperature of 55-65 C. The first etchant may etch W-based structure 401 at a rate of 15-25 nm/min, TiAl- or TiC-based structure 405 at a rate of 15-25 nm/min, and TiN-based structure 403 at a rate of 1-3 nm/min. Exposure 402 to the first etchant continues until W-based structure 401 is recessed to a depth d1, which is more than about 75% of the desired uniform depth d2. Optionally, the substrate may be rinsed 410 and/or dried 412. The second etchant is a concentrated nitric acid ($HNO_3$, e.g., ~70 wt %) at a temperature of 60-95 C. The second etchant may leave the W-based structure 411 substantially intact and etch the TiN-based structure 413 at a rate of about 6-10 nm/min (at 95 C; etch rates may be temperature-dependent), and etch the TiAl- or TiC-based structure 405 about 3-4 times faster than it etches the TiN. The substrate is exposed 406 to the second etchant until the W-based and Ti-based structures are all recessed to the desired uniform depth d2 (e.g., 5-50 nm or about 30 nm).

Figure 5:
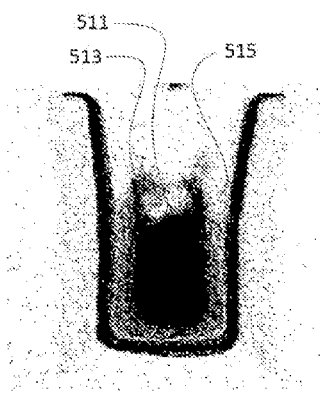
FIG. 5 is adapted from an SEM photograph of a partially etched multi-material structure after exposure to the first etchant of Example Process 1.

FIG. 5 is adapted from an SEM photograph of a partially etched multi-material structure after exposure to the first etchant of Example Process 1. The gamma, contrast, brightness and sharpness are adjusted to make some of the features visible without grayscale. Here, W structure 511 and TiAl structure 515 are recessed to approximately the same depth, but TiN structure 513 is etched to a lesser depth. Exposure to the second etchant will etch the TiN more rapidly than the TiAl or the W and uniformly recess all three structures.

Example Process 2

In some embodiments, Ti-based structure 405 contains TiC or TiAlC and Ti-based structure 403 contains TiN. Other structures 407 may include TaN or a high-k oxide. The TiC/TiAlC and TiN may additionally include dopants and may be deposited by ALD or PVD. The first etchant is a hydrogen peroxide solution, such (e.g., 1:2 $H_2O_2:H_2O$) at a temperature of 20-30 C. The first etchant may etch W-based structure 401 at a rate of about 11-15 nm/min, TiC/TiAlC-based structure 405 at a rate of about 18-22 nm/min, and TiN-based structure 403 at a rate of about 6-10 nm/min. Exposure 402 to the first etchant continues until W-based structure 401 is recessed to a depth d1, which is more than about 75% of the desired uniform depth d2. Optionally, the substrate may be rinsed 410 and/or dried 412. The second etchant is an acid solution with a very small, but non-zero, amount of $H_2O_2$ (e.g., an unusual formulation of SC-2~1:0.0125:2 $HCl:H_2O_2:H_2O$) at a temperature of 55-65 C. The second etchant may leave the W-based structure 411 substantially intact, or etch it at a rate less than 1 nm/min. and etch the TiC/TiAlC-based structure 415 at about 5-8 nm·min and the TiN-based structure 413 at a somewhat lower rate. The substrate is exposed 406 to the second etchant until the W-based and Ti-based structures are all recessed to the desired uniform depth d2 (e.g., 5-50 nm).

Figure 6:
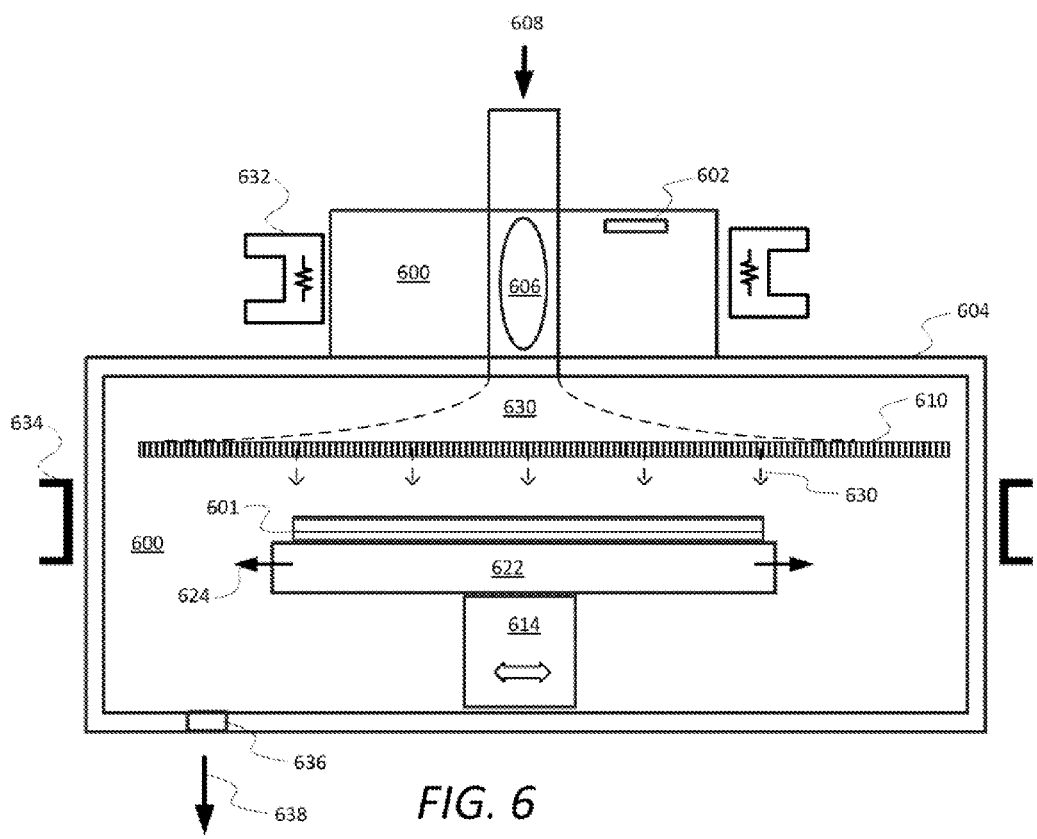
FIG. 6 is a block-diagram example of a plasma etching apparatus.

FIG. 6 is a block-diagram example of a plasma etching apparatus. Remote plasma source 602 is mounted on chamber lid 604 (either directly, as illustrated, or through a flange). Remote plasma 606 is entrained into a central gas flow 608 in remote plasma chamber 603 toward a showerhead 610. An electromagnet 632 may be part of remote plasma chamber 603. The showerhead is inside process chamber 600 between remote plasma source 602 and substrate 601, and distributes activated species 630 over substrate 601. Alternatively, a plasma may be generated over substrate 601 (a "direct plasma") besides or instead of remote plasma 606. Permanent magnets 634 may be configured to confine either direct or remote plasma near substrate 601.

A substrate positioning system 614 can position substrate 601 directly under showerhead 610. Substrate positioning system 614, in this example, provides two displaced axes of rotation, 616 and 618. Alternatively, other positioning systems such as X-Y translators may be used. In addition, substrate support 622 may move in a vertical direction. Substrate support 622 may include a substrate heater (e.g., resistive or inductive) and can be larger than the largest substrate to be processed. Substrate support 622 may also provide a gas purge flow 624 from the edges of the support, using argon, helium, or any other gas that is not reactive under the process conditions. Gases may be removed from the chamber by exhaust flow 638 through exhaust port 636.

FIG. 7A is a flowchart of an example method for uniformly etching W with TiN and TiC, TiAlC, or another TiC compound by a two-step wet/plasma process. FIGS. 7B-7D conceptually illustrate a multi-material structure at different stages of FIG. 7A's process. A substrate with structures is initially prepared 700. The structures may include at least one W-based structure 701, at least one Ti-based structure 703 that includes TiC, TiAlC, or another TiC compound, at least one Ti-based structure 705 including TiN, and one or more other structures 707. The number of W- and Ti-based structures may be any number greater than zero. The structures may or may not have arrangements or shapes similar to the example in FIGS. 7B-7D.

The substrate, with its structures 701, 703, 705, and 707, is exposed 702 to a wet etchant. The first etchant may contain $H_2O_2$ or HF. Exposure 702 continues until condition 704 is met: Carbon-containing Ti-based structure 703 is recessed to a depth d1, leaving recessed W-based structure 711. W-based structure 701 and nitrogen-containing Ti-based structure 705 are etched at the same rate or at a lower rate than carbon-containing Ti-based structure 703, leaving recessed W-based structure 711 and recessed Ti-based structure 715 recessed at some depth between 0 and d1. Other structures 707 are etched less than W-based structure 701. In some embodiments, at least one of structures 701, 705, and 707 may be substantially intact after exposure 702. Optionally, the substrate may be rinsed 710 and/or dried 712 after finishing exposure 702 to the first etchant.

Next, the substrate, with its structures 711, 713, 715, and 707, is exposed 706 to an etching plasma. Exposure 706 continues until condition 708 is met: recessed W-based structure 711 and Ti-based structures 713 and 715 are uniformly recessed to a depth d2, leaving fully-etched Ti-based structures 723 and 725 and fully-etched W-based structure 721. Because carbon-containing Ti-based structure 713 is recessed, any residues generated by plasma etching of this layer do not significantly block the plasma from etching W-based structure 711 and recessed Ti-based structure 715. Other structures 707 are etched less than Ti-based structures 703 and 705. In some embodiments, at least one of other structures 707 may be substantially intact after exposure 706. Optionally, the substrate may be rinsed 710 and/or dried 712 after finishing exposure 706 to the second etchant. The next process can then proceed 799.

Example Process 3

In some embodiments, carbon-containing Ti-based structure 703 contains TiC, TiAlC, or a similar TiC compound, and Ti-based structure 705 contains TiN. Other structures 707 may include TaN or a high-k oxide. Ti-based structures 703 and 705 may additionally include dopants and may be deposited by ALD or PVD. The wet etchant is one of (1) highly dilute (e.g., 1000:1-5000:1) HF at 25-35 C, (2) ultra-dilute sulfuric peroxide (udSP, <~1 picomol/liter) mixed with 50 to 500 ppm HF at 25-35 C, (3) a 1:1-100:1 water-HCl mixture, optionally with a small amount of hydrogen peroxide (e.g., 1 part $H_2O_2$ for every 10 parts HCl), or (4) a 1:1-100:1 water-$NH_4OH$ mixture, optionally with a small amount of hydrogen peroxide (e.g., 1 part $H_2O_2$ for every 10 parts $NH_4OH$).

The first etchant may etch W-based structure 701 at a rate less than 0.004 nm/min, carbon-containing Ti-based structure 703 at a rate of 5-20 nm/min, TiN-based structure 705 at a rate less than 0.09 nm/min, and TaN-based structure (one of other structures 707) at a rate less than 0.02 nm/min. Exposure 702 to the first etchant continues until carbon-containing Ti-based structure 703 is recessed to a depth d1, which is more than about 75% of the desired uniform depth d2. For example, the exposure time may be 30-120 seconds. Optionally, the substrate may be rinsed 710 and/or dried 712.

The plasma etch may use sources of halogens such as fluorine (F) or chlorine (Cl), other reactive gases such as oxygen ($O_2$), diluent gases such as helium (He), argon (Ar) or nitrogen ($N_2$). For example, sulfur hexafluoride ($SF_6$) may be excited to plasma by a 180-220 W, 13-14 MHz RF plasma generating source with a process temperature of 35-45 C, a flow rate of 80 sccm, and a chamber pressure of 140-160 mTorr may etch W at 260-400 nm/min and Ti-based materials at a rate >10 nm·min. Other gas mixes may include $CF_4/CL_2$ or $CF_4/HCl$ at ambient pressures near 100 mTorr.

Because carbon-containing Ti-based structure 713 was partially recessed by the wet etchant, it does not produce sufficient residues to block etching of the other Ti-based structures and the W-based structures. The substrate is exposed 706 to the etching plasma until the W-based and Ti-based structures are all recessed to the desired uniform depth d2 (e.g., 5-50 nm).

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A method of uniformly etching a plurality of structures of different materials on a substrate, the method comprising:
   exposing the substrate to a first etch process until a first subset of the structures is etched to a first depth;
   exposing the substrate to a second etch process until a second subset of the structures is etched to a second depth;
   wherein the first subset of the structures comprises W;
   wherein the second subset of the structures comprises at least one of titanium nitride (TiN), titanium aluminide (TiAl), or titanium aluminum nitride (TiAlN);
   wherein the first etch process comprises a solution of $H_2O_2$ and an acid; and
   wherein the second etch process comprises a nitric acid ($HNO_3$) solution heated to between 60 C and 95 C,
   wherein a weight percentage of $HNO_3$ in the nitric acid solution is between about 65% and 75%,
   wherein, after being exposed to the first etch process and the second etch process, the first subset and the second subset of the structures are etched to within 15% of the same depth;
   wherein at least one of the first subset or the second subset of the structures comprises tungsten (W);
   wherein at least one of the first subset or the second subset of the structures comprises titanium (Ti); and
   wherein the first etch process comprises a solution containing hydrogen peroxide ($H_2O_2$).

2. The method of claim 1, wherein the structures are subjected to chemical-mechanical polishing before the substrate is exposed to the first etch process or the second etch process.

3. The method of claim 1, wherein the first etch process comprises a solution of the $H_2O_2$, the acid, and water.

4. The method of claim 3, wherein the acid is hydrochloric acid (HCl).

5. The method of claim 3, wherein a ratio of acid:$H_2O_2$:water in the solution of $H_2O_2$ and the acid is about 1:1:4.

6. The method of claim 3, wherein the first etch process is performed at a temperature between 55 C and 65 C.

7. The method of claim 1, wherein the first subset of the structures comprises W;
   wherein the second subset of the structures comprises at least one of titanium nitride (TiN), titanium aluminide (TiAl), or titanium aluminum carbide (TiAlC);
   wherein the first etch process comprises an $H_2O_2$ solution; and
   wherein the second etch process comprises an acid solution with between 0.0001% and 0.04% $H_2O_2$ by weight.

8. The method of claim 7, wherein a ratio of $H_2O_2$:water in the $H_2O_2$ solution is about 1:2.

9. The method of claim 7, wherein the acid solution comprises HCl.

10. The method of claim 7, wherein the acid solution comprises water.

11. The method of claim 7, wherein a ratio of $HCl:H_2O_2:H_2O$ in the acid solution is about 1:0.0125:2.

12. The method of claim 7, wherein the second etch process is performed at a temperature between 55 C and 65 C.

13. The method of claim 7, wherein the first etch process comprises an ultra-dilute (<1 picomol/liter) sulfuric peroxide mixed with 50 to 500 ppm HF at 25-35 C.

14. The method of claim 7, wherein the first etch process comprises a 1:1-100:1 water-HCl mixture or a 1:1-100:1 water-$NH_4OH$ mixture.

15. The method of claim 14, wherein the water-HCl mixture or the water-$NH_4OH$ mixture further comprises at most 1 part for $H_2O_2$ for every 10 parts HCl or $NH_4OH$.

* * * * *